United States Patent
Jiang et al.

(10) Patent No.: US 9,323,122 B2
(45) Date of Patent: Apr. 26, 2016

(54) ARRAY SUBSTRATE AND LIQUID CRYSTAL DISPLAY PANEL COMPRISING DUAL GATE LINES HAVING TFT AND PIXEL CONNECTION BETWEEN THE GATE LINES

(71) Applicant: BEIJING BOE OPTOELECTRONICS TECHNOLOGY CO., LTD., Beijing (CN)

(72) Inventors: Wenbo Jiang, Beijing (CN); Hailin Xue, Beijing (CN); Xue Dong, Beijing (CN); Chuncheng Che, Beijing (CN); Dong Chen, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 193 days.

(21) Appl. No.: 13/895,502

(22) Filed: May 16, 2013

(65) Prior Publication Data
US 2014/0217411 A1    Aug. 7, 2014

(30) Foreign Application Priority Data
Feb. 5, 2013    (CN) .......................... 2013 1 0046141

(51) Int. Cl.
*G02F 1/136*    (2006.01)
*G02F 1/1362*    (2006.01)
(Continued)

(52) U.S. Cl.
CPC .... *G02F 1/136286* (2013.01); *G02F 1/134309* (2013.01); *H01L 27/124* (2013.01);
(Continued)

(58) Field of Classification Search
CPC .................... G02F 1/133707; G02F 1/136286; G02F 2001/134345
USPC ........................................................ 349/43–46
See application file for complete search history.

(56) References Cited

U.S. PATENT DOCUMENTS

2010/0320472 A1    12/2010 Liu
2010/0321602 A1    12/2010 Liu et al.
(Continued)

FOREIGN PATENT DOCUMENTS

CN    101540329 A    9/2009
CN    101706637 A    5/2010
(Continued)

OTHER PUBLICATIONS

First Chinese Office Action Appln. No. 201310046141.2; Dated Nov. 25, 2014.
(Continued)

*Primary Examiner* — Huyen Ngo
(74) *Attorney, Agent, or Firm* — Ladas & Parry LLP

(57) ABSTRACT

Embodiments provide an array substrate and a liquid crystal display panel. The array substrate comprises: a substrate, data lines and gate lines which are provided on the substrate and intersect with each other, and sub-pixel units which are defined by surrounding of the data lines and the gate lines and are arranged in an array form. Two gate lines for respectively driving the sub-pixel units in two adjacent rows are located between the sub-pixel units in the two adjacent rows; each sub-pixel unit comprises a thin film transistor (TFT) and a pixel electrode, and a connection area of the TFT and the pixel electrode is located between the two gate lines adjacent to the sub-pixel unit and has no overlapping area with a projection of the two gate lines in a perpendicular direction of the array substrate.

13 Claims, 9 Drawing Sheets

(51) Int. Cl.
*H01L 27/12* (2006.01)
*G02F 1/1343* (2006.01)

(52) U.S. Cl.
CPC ....... *G02F1/13624* (2013.01); *G02F 1/136227* (2013.01); *G02F 2001/13606* (2013.01); *G02F 2001/134345* (2013.01)

(56) References Cited

U.S. PATENT DOCUMENTS

| | | |
|---|---|---|
| 2010/0328564 A1 | 12/2010 | Jeong et al. |
| 2011/0181805 A1* | 7/2011 | Nagami .................... 349/43 |
| 2013/0141660 A1* | 6/2013 | Wang et al. .................... 349/43 |
| 2013/0155034 A1* | 6/2013 | Nakayama et al. ........... 345/204 |
| 2014/0306916 A1* | 10/2014 | Wang et al. .................... 345/173 |
| 2014/0362323 A1* | 12/2014 | Nakano et al. ................. 349/46 |

FOREIGN PATENT DOCUMENTS

| | | |
|---|---|---|
| CN | 203084393 U | 7/2013 |
| KR | 20030028971 A | 4/2003 |
| KR | 20110001862 A | 1/2011 |
| WO | 2010/0127515 A1 | 11/2010 |

OTHER PUBLICATIONS

Korean Office Action dated Apr. 28, 2014; Appln. No. 10-2013-0055795.
Extended European Search Report dated May 19, 2014; Appln. No. 13167993.8-1508.

\* cited by examiner

ARRAY SUBSTRATE AND LIQUID CRYSTAL DISPLAY PANEL COMPRISING DUAL GATE LINES HAVING TFT AND PIXEL CONNECTION BETWEEN THE GATE LINES

BACKGROUND

Embodiments of the present invention relate to an array substrate and a liquid crystal display panel.

Advanced super dimensional switch (ADS) technology is a plane electric field wide viewing angle technology for liquid crystal displays; in this technology, multi-dimensional electric field is formed by an electric field produced at edges of slit electrodes on the same plane and an electric field produced between the layer of the slit electrodes and the layer of plate-like electrodes, so as to allow liquid crystal molecules at all orientation within a liquid crystal cell, which are located directly above the electrode and between the slit electrodes, to be rotated, and thereby the work efficiency of liquid crystals is enhanced and the transmissive efficiency is increased.

As the market demand for ADS mode liquid crystal display products continues to rise, it is the goal pursued by every manufacturer continually to make the products have a higher aperture ratio and higher yield.

SUMMARY

According to an embodiment of the invention, there is provided an array substrate, comprising: a substrate, data lines and gate lines which are provided on the substrate and intersect with each other, and sub-pixel units which are defined by surrounding of the data lines and the gate lines and are arranged in an array form; two gate lines for respectively driving the sub-pixel units in two adjacent rows are located between the sub-pixel units in the two adjacent rows; each sub-pixel unit comprises a thin film transistor (TFT) and a pixel electrode, the TFT and the pixel electrode are electrically connected so as to function as a switch element, and a connection area of the TFT and the pixel electrode is located between the two gate lines adjacent to the sub-pixel unit and has no overlapping area with a projection of the two gate lines in a perpendicular direction of the array substrate.

In the array substrate, for example, among the two gate lines between the sub-pixel units in the two adjacent rows, the gate line in a preceding row is connected to the sub-pixel units in a following row, the gate line in the following row is connected to the sub-pixel units in the preceding row, and the two gate lines act to drive the sub-pixel units connected to them, respectively.

In the array substrate, for example, among the two gate lines between the sub-pixel units in the two adjacent rows, the gate line in a preceding row is connected to the sub-pixel units in the preceding row, the gate line in a following row is connected to the sub-pixel units in the following row, and the two gate lines act to drive the sub-pixel units connected to them, respectively.

In the array substrate, for example, the TFT of each sub-pixel unit is provided on one of the gate lines for driving the sub-pixel unit, a drain electrode of the TFT is connected to the pixel electrode within the sub-pixel unit, and there is no overlapping area between the drain electrode and a projection of the other of the two gate lines in the perpendicular direction.

In the array substrate, for example, TFTs of two sub-pixel units in a same column among the sub-pixel units in the two adjacent rows are provided to be staggered with each other.

In the array substrate, for example, the pixel electrode comprises a portion located between the two of the gate lines adjacent to the pixel unit and a portion located outside of the two of the gate lines, and the drain electrode is connected to the portion located between the two of the gate lines in the pixel electrode.

In the array substrate, for example, each sub-pixel unit further comprises a common electrode, and the common electrode, the gate line corresponding to the pixel unit, and the pixel electrode are located on different layers and insulated from each other.

In the array substrate, for example, the common electrode is located under the pixel electrode and over the gate line corresponding to the pixel unit; and the gate line corresponding to the pixel unit is located within a projection area of the common electrode in the perpendicular direction.

For example, the array substrate may further comprise a plurality of common electrode lines which are located below the common electrode and insulated from the common electrode, and the common electrode is connected to one of the common electrode line through a second via hole.

In the array substrate, for example, the plurality of common electrode lines are distributed in a display area and a periphery area of the array substrate.

In the array substrate, for example, the drain electrode and the pixel electrode are located on different layers, and are electrically connected through a first via hole.

According to another embodiment of the invention, there is provided a liquid crystal display panel, comprising a counter substrate and any of the above array substrates which are assembled together to form a cell.

In the liquid crystal display panel, for example, a projection of the gate lines falls within projection of a black matrix on the counter substrate.

In the liquid crystal display panel, for example, on the counter substrate, when one pixel unit is composed of the sub-pixel units in three colors, a black matrix corresponding to the gate lines and a black matrix corresponding to the common electrode lines have a same width; when one pixel unit is composed of the sub-pixel units in at least four colors, a black matrix corresponding to the gate lines and a black matrix corresponding to the common electrode lines have different widths.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Unless otherwise defined, the technical terminology or scientific terminology used herein should have the same meaning as commonly understood by one of ordinary skill in the art to which this invention belongs. "First", "second" and the like used in specification and claims of the patent application of the invention do not show any order, number or importance, but are only used to distinguish different constituent parts. Likewise, terms such "a," "an," "the" or the like does not indicate limitation in number, but specifies the presence of at least one. The term such as "comprises," "comprising," "comprises," "comprising", "contains" or the like means that an element or article prior to this term encompasses element(s) or article(s) listed behind this term and equivalents, but does not preclude the presence of other elements or articles. The term such as "connection," "connected," or the like is not limited to physical or mechanical connection, but can comprise electrical connection, whether directly or indirectly. "Upper," "lower," "left," "right" or the like is only used to describe a relative positional relationship, and when an absolute position of the described object is changed, the relative positional relationship might also be changed accordingly.

Figure 1:
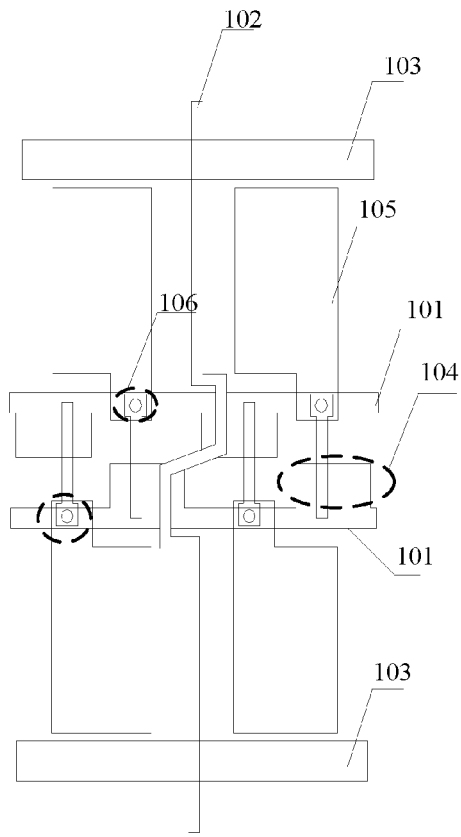
FIG. 1 is a schematically top view showing part of the structure of a TFT array substrate.

FIG. 1 is a partially schematic view showing an array substrate of a high aperture ratio. The array substrate comprises gate lines 101 and data lines 102, which are provided to intersect each other, the gate lines 101 extend transversely, the data lines 102 extend longitudinally, and common electrode lines 103 extend in parallel to the gate lines 101; sub-pixel units are defined by surrounding of the data lines 102, the gate lines 101 and the common electrode lines 103. FIG. 1 only illustrates upper and lower sub-pixel units in two columns of sub-pixel units, which sub-pixel units are adjacent along a vertical direction. Each sub-pixel unit comprises one thin film transistor (TFT) 104 functioning as a switch element and one pixel electrode 105, the thin film transistor 104 being electrically connected to the pixel electrode 105 so as to control the pixel electrode 105; two adjacent rows of gate lines 101 are located between the sub-pixel units in two adjacent rows, and the gate electrodes of the TFTs of the two sub-pixel units in the same column among the sub-pixel units in the two adjacent rows are staggered and opposed to each other. In the drawing, for example, two adjacent rows of common electrode lines 103 are separated by two rows of sub-pixel units. As shown in FIG. 1, a first via hole 106 for connecting the drain electrode D of the TFT 104 of the sub-pixel unit in the preceding row located in a column to a pixel electrode 105, is located within the region of the gate line 101 for the TFT 104 of the sub-pixel unit in the following row of the same column. That is, in the direction of light transmission, the projection of the first via hole 106 completely falls within the projection of the gate line 101 for the sub-pixel unit in the following row. Such a layout design makes the aperture ratio of the array substrate higher, but this also leads to a phenomenon of flicker defect in thus-formed array substrate.

Figure 2:
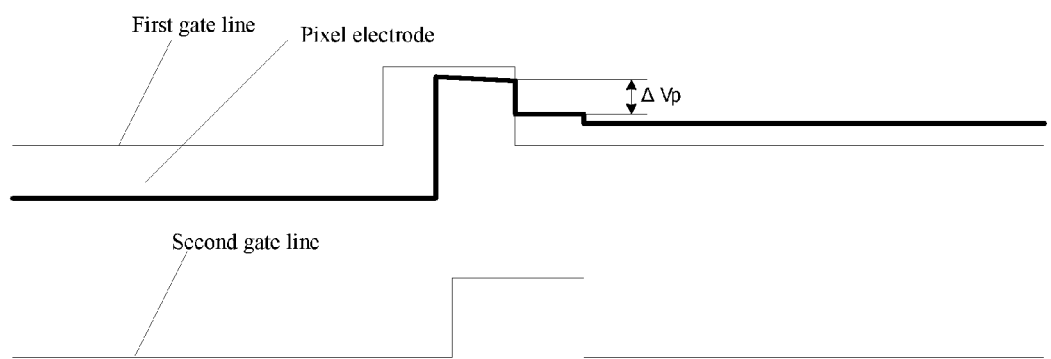
FIG. 2 is a diagram illustrating work timings of gate lines and a pixel electrode in the array substrate shown in FIG. 1.

Specifically, in the above layout design, there is an overlapping area between the projection of the TFT of each of sub-pixel units and the projection of the gate line, which is used for driving the sub-pixel unit provided in opposition to the aforesaid sub-pixel, in the perpendicular direction. In this layout design, the change of the voltage over a pixel electrode of a sub-pixel unit along with a gate-line voltage is shown in FIG. 2. As shown in FIG. 2, scan signals are applied to a first gate line and a second gate line consecutively, and the pixel electrode in the figure is the pixel electrode of a sub-pixel unit corresponding to the first gate line. The voltage over the pixel electrode will drop one time after the charging operation of a gate line corresponding to the pixel unit, to which it belongs, ends, and this drop is the so-called pixel-electrode voltage drop ΔVp. Moreover, as there is an overlapping area in the vertical direction between the TFT connected to the pixel electrode and the gate line for an adjacent pixel unit, a voltage drop over an adjacent gate line will affect the voltage over the pixel electrode. Accordingly, the voltage is pulled down again, leading to a second voltage drop. Thus, the above layout design may cause a phenomenon of flicker defect to occur in the course of displaying images.

With respect to the above problem, embodiments of the invention provide an array substrate and a liquid crystal display panel, intended to solve the phenomenon of flicker defect occurring in the course of displaying images by a liquid crystal display panel.

Hereinafter, embodiments of the invention will be described in detail with accompanying drawings.

Figure 3:
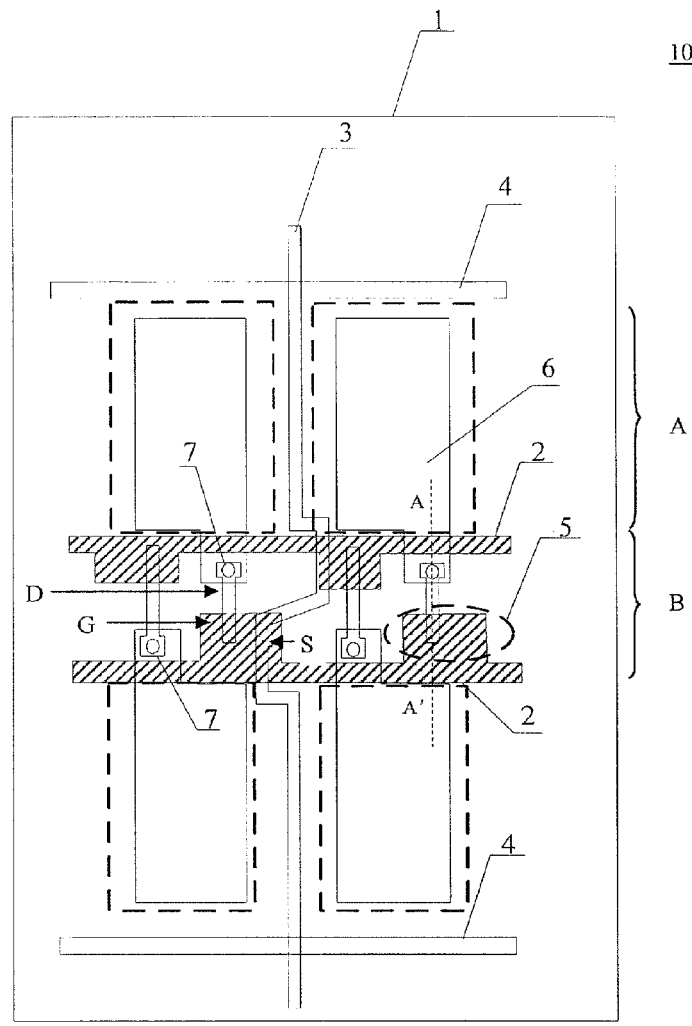
FIG. 3 is schematically top view showing the structure of an array substrate with a spread-eagled TFT provided by an embodiment of the invention.

Referring to FIG. 3, an array substrate 100 provided by an embodiment of the invention comprises: a substrate 1, a plurality of gate lines 2 and a plurality of data lines 3 which are located on the substrate 1 and intersect each other, and common electrode lines 4. In FIG. 3, the gate lines 2 are provided to extend transversely, the data lines are provided to extend longitudinally and the common electrode lines 4 are parallel to the gate lines 2 and provided transversely. The substrate 1 is such as a glass or plastic base substrate.

One sub-pixel unit is formed by surrounding of a gate line 2, a data line 3 and a common electrode line 4; a plurality of sub-pixel units are arranged in an array form, such as, periodically arranged in a matrix form. As shown in FIG. 3, the area enclosed by the broken-line box is a main part of one sub-pixel unit. The region of sub-pixel units on the array substrate is a light transmitting area A, and the region between adjacent sub-pixel units is a light-proof area B. For example, the region on the array substrate 100 where the common electrode lines 4, the data lines 3 and the gate lines 2 are located belongs to the light-proof area B.

As shown in FIG. 3, between two adjacent rows of sub-pixel units, there are provided two gate lines 2 separated from each other by a certain distance, and these two gate lines act to drive the sub-pixel units in the two adjacent rows.

Provided that these two gate lines 2 constitute a group of gate lines; a common electrode line 4 may be located between two groups of gate lines which are adjacent to each other. For example, in the light-proof area B of the substrate 1, common electrode lines 4 and every two immediately adjacent gate lines 2 (a group of gate lines) are arranged alternately. For example, it is possible that one common electrode line 4 is located between two rows of adjacent sub-pixel units, and two immediately adjacent gate lines 2 (a group of gate lines) are located between other two rows of adjacent sub-pixel units.

In the example shown in FIG. 3, among sub-pixel units on two sides of the two immediately adjacent gate lines 2, sub-pixel units belonging to the same column are provided opposite to each other; namely, they are opposed to each other via the two gate lines interposed therebetween. The opposite disposition is not limited to the directly disposition shown in FIG. 3, but there may be an offset to some degree.

In the embodiment of the invention, as to the two rows of sub-pixel units which are adjacent to each other via a group of gate lines interposed therebetween, the gate line which is closer to sub-pixel units in the preceding row (called as a gate line in the preceding row) may drive the sub-pixel units in the preceding row or drive sub-pixel units in the following row; accordingly, the gate line in the following row may drive the sub-pixel units in the following row or the sub-pixel units in the preceding row, which is not driven by the gate line in the preceding row. In this way, specifically the following two driving manners may be possible.

The first driving manner is: the gate line which is closer to sub-pixel units in the preceding row (an upper gate line in the figure) corresponds to sub-pixel units in the following row, namely, the gate line which is closer to sub-pixel units in the preceding row drives sub-pixel units in the following row. The gate line which is closer to sub-pixel units in the following row (a lower gate line in the figure) corresponds to sub-pixel units in the preceding row, namely, the gate line which is closer to sub-pixel units in the following row drives sub-pixel units in the preceding row.

The second driving manner is: the gate line which is closer to sub-pixel units in the preceding row (an upper gate line in the figure) corresponds to sub-pixel units in the preceding row, namely, the gate line which is closer to sub-pixel units in the preceding row drives sub-pixel units in the preceding row. The gate line which is closer to sub-pixel units in the following row (a lower gate line in the figure) corresponds to sub-pixel units in the following row, namely, the gate line which is closer to sub-pixel units in the following row drives sub-pixel units in the preceding row.

The exemplary gate line driving manner of the array substrate shown in FIG. 3 belongs to the first driving manner stated above.

As shown in FIG. 3, each of sub-pixel units comprises: a TFT 5 located in a light-proof area and a pixel electrode 6 in a light transmitting area. The TFT 5 functions as a switch element and is electrically connected to the pixel electrode 6 so as to control the pixel electrode 6. For example, a source electrode S of the TFT 5 is electrically connected to (or integrally formed with) a data line 3, a drain electrode D of the TFT 5 is electrically connected to the pixel electrode 6, and a gate electrode G of the TFT 5 is electrically connected to (or integrally formed with) a corresponding gate line 2. There is no overlapping area between the projection of the drain electrode D of the TFT 5 and the projection of any of two adjacent gate lines 2 in the perpendicular direction of the array substrate (briefly called as "perpendicular direction" below), namely, they do not overlap in the perpendicular direction.

The connecting location of the drain electrode D and the pixel electrode 6 is a connection area 7 between the TFT 5 and the pixel electrode 6 as shown in FIG. 3, and the connection area 7 is located between two gate lines adjacent to the sub-pixel unit. When there is no overlapping area between the projection of the drain electrode D and the projection of any one of two adjacent gate lines 2 in the perpendicular direction, accordingly, there is no overlapping area between the connection area 7 and the projection of the gate line in the perpendicular direction, namely, they do not overlap in the perpendicular direction.

Preferably, the connection area 7 shown in FIG. 3 may be located in the light transmitting area A or the light-proof area B. However, if the connection area 7 is provided in the light transmitting area A, this will result in reduction of aperture ratio of the pixel.

Preferably, the connection area B is provided in the light-proof area B. In this case, the pixel electrode 6 located in the light transmitting area A further comprises a protrusion portion located in the light-proof area B, and the drain electrode D of the TFT 5 is electrically connected to the protrusion portion of the pixel electrode 6 located in the light-proof area B. As such, the problem that the aperture ratio of the pixel is reduced can be avoided.

Protrusion portions of pixel electrodes 6 of two sub-pixel units which are provided opposite to each other and belong to the same column are provided to be opposed and staggered with each other. As shown in FIG. 3, in the extending direction of gate lines, one protrusion portion is located on the left, and the other is located on the right.

Preferably, the drain electrodes of the two TFTs respectively connected to the two adjacent gate lines are respectively connected to the pixel electrodes in sub-pixel units which are provided opposite to each other; there is no overlapping area of the connection area between the drain electrode of the TFT connected to one of the gate lines and a corresponding pixel electrode with the projection of the other gate line (i.e., the adjacent gate line) provided in opposition to the gate line in the perpendicular direction, namely, they do not overlap in the perpendicular direction.

For example, TFTs of two sub-pixel units in the same column among sub-pixel units in the two adjacent rows are provided to be staggered. In this case, a data line 3 is connected alternately to the TFTs of sub-pixel units located on two sides of it. As shown in FIG. 3, the data line 3 is connected to the TFTs of the sub-pixel units on the top-right corner and on the bottom-left corner among four pixels.

In FIG. 3, a bended part of the data line 3 is overlapped with a protrusion portion of a gate line 2 that acts as a gate electrode G, and the bended part constitutes a source electrode S of a TFT, but the embodiments of the invention are not limited thereto. For example, the data line 3 may extend in a straight line along the longitudinal direction, and a conductive part for forming a source electrode of a TFT is a protrusion portion protruding from the data line 3.

Figure 4:
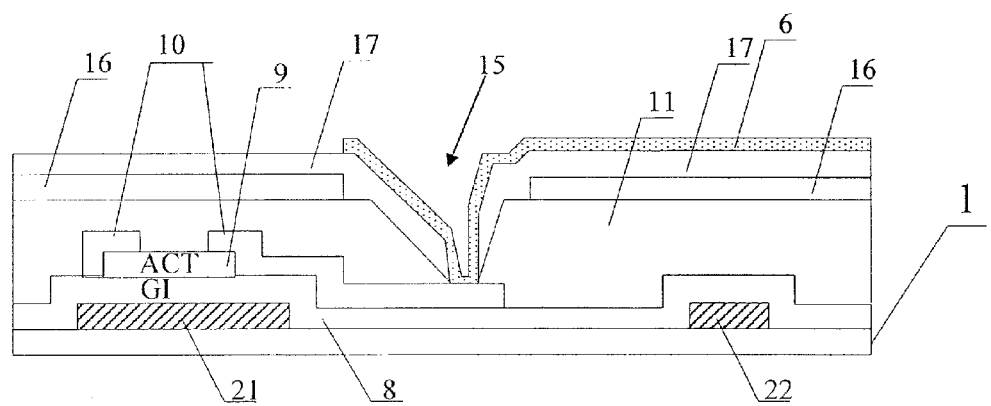
FIG. 4 is a schematic view showing a cross-section of the array substrate shown in FIG. 3 taken along a direction of A-A'.

For explaining the positional relationship between individual parts on the array substrate provided by the above embodiment more clearly, descriptions will be given below with reference to FIG. 4. FIG. 4 is a cross-sectional view of the array substrate shown in FIG. 3 taken along a direction of A-A'.

FIG. 4 is a schematically cross-sectional view of part of the array substrate 100 according to the embodiment of the invention. The array substrate 100 comprises: a substrate 1; and a first gate electrode 21 and a second gate line 22 which are located on the substrate 1. The first gate electrode 21 corresponds to a lower gate line in the part of the array substrate shown in FIG. 3; and the second gate line 22 corresponds to an upper gate line in the part of the array substrate shown in FIG. 3.

The array substrate 100 further comprises: a gate insulating layer (GI) 8 on the first gate electrode 21 and the second gate line 22, an active layer (ACT) 9 located on the first gate electrode 21, a source-drain electrode layer located on the active layer 9, and a resin layer located on the source-drain electrode layer 10 and over the second gate line 22. The first gate electrode 21, the gate insulating layer (GI) 8, the active layer 9, and the source-drain electrode layer 10 constitute one TFT, namely, they constitute one TFT connected to a pixel electrode on the top-right side shown in FIG. 3. The source-drain electrode layer 10 comprises a source electrode S and a drain electrode D of the TFT. The active layer 9 may be formed of a silicon semiconductor material (such as amorphous silicon), an oxide semiconductor material (such as IGZO), an organic semiconductor material, or the like.

The array substrate 100 further comprises a pixel electrode 6 for each of sub-pixel units located on the resin layer 11. The pixel electrode 6 may comprise a portion located in the light transmitting area A and a portion located in the light-proof area B. For example, the portion of the pixel electrode in the light-proof area B is electrically connected to the drain electrode in the source-drain electrode layer 10 of the TFT below it through a first via hole 15.

In the array substrate provided by the embodiment of the invention, one of the two adjacent gate lines between two adjacent rows of sub-pixel units acts to drive one of the two adjacent rows of the sub-pixel units. In the embodiment of the invention, because the TFT of each sub-pixel unit is located in the light-proof area B of the array substrate, the aperture ratio of the pixel unit is not affected.

In the array substrate provided by the embodiment of the invention, for each sub-pixel unit, the drain electrode of the TFT located in the light-proof area B is electrically connected to a portion of the pixel electrode, which portion is located in the light-proof area B, and this can ensure that the aperture ratio of the pixel is not affected. Further, there is no overlapping area between the projection of the drain electrode of the TFT of each of sub-pixel units and the projection of the gate line, which is provided in opposition to the gate line corresponding to the TFT, in the perpendicular direction. So, this can solve the problem that flicker defect occurs during display of images. One main reason of the flicker defect is that TFTs are affected by gate lines. If there is an overlapping area in the perpendicular direction between a pixel electrode and a gate line, this gives rise to certain direct capacitance C between the pixel electrode and the gate line. Accordingly, this will make the voltage over the pixel electrode, which has been charged to a certain value, be pulled down. Pull-down of the voltage produces a voltage drop $\Delta Vp$, and if it is not treated well, a jitter phenomenon will occur in displaying images, namely, a phenomenon of flicker defect occurs in displaying images. The array substrate according to the embodiment of the invention meets the following condition: for a group of gate lines, there is no overlapping area of a connection area between the drain of a TFT and a pixel electrode (i.e., a connection area of the TFT and the pixel electrode) with the projection of a gate line, provided in opposition to the gate line corresponding to the TFT, in the perpendicular direction. In this way, no direct capacitance C is generated between the connection area, between the drain electrode of the TFT and the pixel electrode, and the gate line provided in opposition to the corresponding gate line, and amount of the voltage drop $\Delta Vp$ is decreased, so that the voltage of the pixel electrode will not be pulled down twice consecutively after completion of charging. Thus, such a serious problem of flicker defect is relieved or solved.

Referring to FIG. 4, the array substrate 100 provided by the embodiment of the invention may further comprise a common electrode 16 located between the pixel electrode 6 and the resin layer 11; the common electrode 16 may be connected to a common electrode line 4 shown in FIG. 3 through a second via hole (not shown in FIG. 4). The array substrate in the example is of a horizontal electric field type, but if the array substrate provided by an embodiment of the invention is of a vertical electric field type, then the array substrate may not comprise a common electrode for generating the electric field for driving liquid crystals, while the common electrode is provided on a counter substrate used in cooperation with the array substrate.

The array substrate 100 shown in FIG. 4 may further comprise a passivation protective layer (PVX) 17 located between the common electrode 16 and the pixel electrode 6.

The profile of the pixel electrode 6 shown in FIG. 3 is substantially a rectangle; the pixel electrode and the common electrode located on different layers in the embodiment of the invention may be a plate-like electrode or a slit electrode (e.g., a comb-like electrode). For example, the pixel electrode on an upper layer is a slit electrode, and the underlying common electrode is a plate-like electrode; or the pixel electrode on an upper layer is a slit electrode, and the underlying common electrode is also a slit electrode.

Common electrodes of all the sub-pixel units arranged in an array form may be integrally formed with each other, namely, the common electrodes are integrally formed on the whole array substrate (which may comprise slits, via holes, or other like patterns as well). In this case, the array substrate may have no common electrode line.

Figure 5:
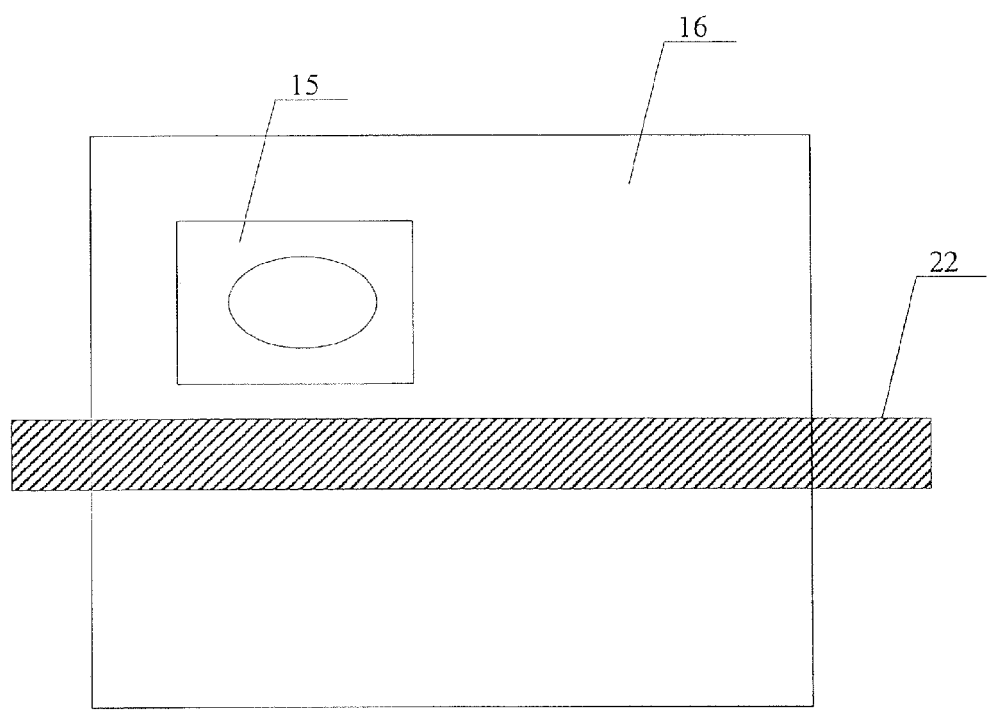
FIG. 5 is a partially enlarged diagram showing the positional relationship between a first via hole and a second gate line shown in FIG. 4.

Preferably, as shown in FIG. 5, in order to prevent the pixel electrode 6 of a sub-pixel unit from being affected by a second gate line 22 below it and thus prevent the work voltage of the pixel electrode 6 from being pulled down by the second gate line 22 to cause flicker defect, the common electrode 16 provided by the embodiment of the invention covers the whole width of the second gate line 22. Thus, pull-down impact of the second gate line 22 on the pixel electrode 6 can be prevented. That is, the common electrode 16 is located under the pixel electrode 6 and over the second gate line 22; and the second gate line 22 is located within the projection area of the common electrode 16 in the perpendicular direction. So, in addition to the portion located in the light transmitting area A, the common electrode 16 further have a portion located in the light-proof area B.

As shown in FIG. 4, there is no overlapping area between the projection of the maximum cross-section of the first via hole 15 for connecting a TFT and a pixel electrode in the perpendicular direction and the second gate line 22, and the first via hole 15 is located in a connection area 7 shown in FIG. 3. FIG. 5 is a schematically partially-enlarged diagram showing the positional relationship among the second gate line 22, the common electrode 16, and the maximum cross-section of the first via hole 15. The second gate line 22 is located within the projection area of the common electrode 16 in the perpendicular direction, while and the first via hole 15 is located outside the area where the second gate line 22 is located.

Common electrode lines 4 are arranged on the array substrate periodically or non-periodically. For the array substrate shown in FIG. 3, the common electrode lines 4 are arranged on the array substrate periodically. That is, two adjacent rows of common electrode lines 4 may be separated by a plurality of rows of sub-pixel units, and the row amount of sub-pixel units between any two adjacent rows of common electrode lines 4 may be the equal to each other or not. A plurality of common electrode lines 4 may be connected to common electrodes of sub-pixel units within a display area of the array substrate or may be connected to them within a non-display area on the periphery of the array substrate.

The connection relationship between common electrode lines 4 and common electrodes of sub-pixel units may be in the following circumstance for example. Individual common electrode lines 4 are connected to common electrodes of respective sub-pixel units through second via holes. Specifically, a common electrode line is electrically connected to common electrodes above it periodically through second via holes, and functions to reduce resistances of the common electrodes in a parallel connection way.

Figure 6:
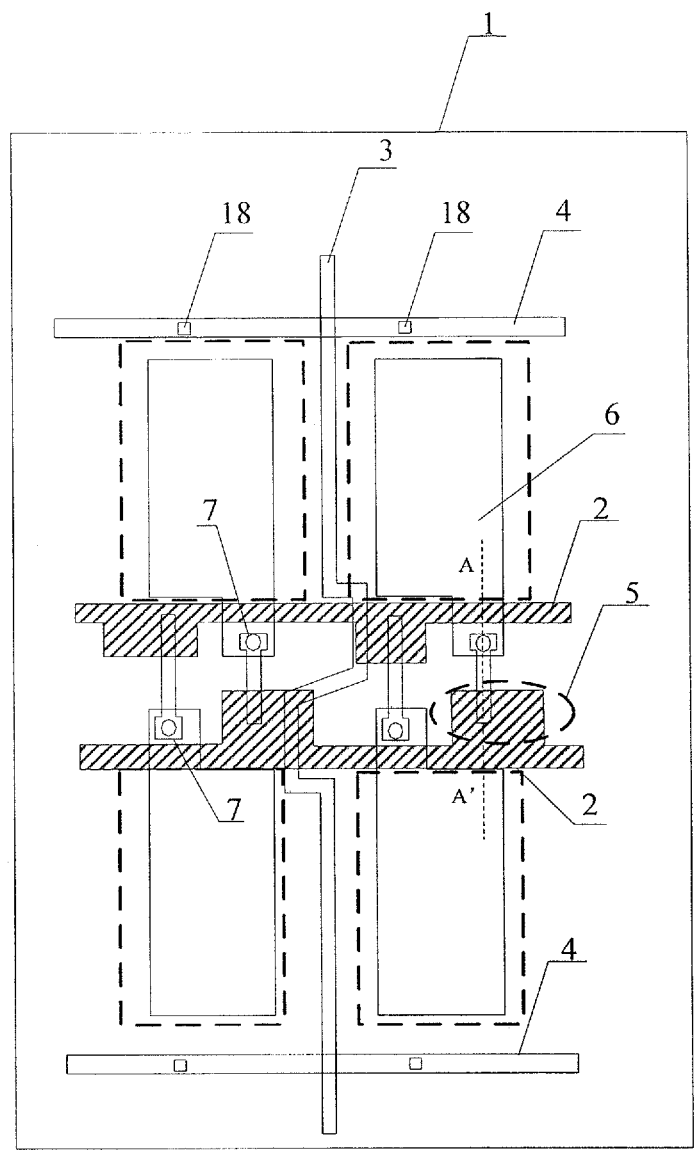
FIG. 6 is a schematically top view showing the structure of an array substrate with a second via hole provided by an embodiment of the invention.

FIG. 6 is a schematically top view showing the connection of a common electrode line 4 on the substrate 1 and the common electrodes 16 above it through second via holes 18.

Or only common electrode lines 4 located in a periphery area are connected to common electrodes 16 of corresponding sub-pixel units through second via holes 18.

For example, as shown in FIG. 6, common electrode lines 4 are connected to common electrodes of sub-pixel units through via holes 18, and the number of second via holes 18 for each of the common electrode lines 4 to connect common electrodes of sub-pixel units are at least two.

Figure 7:
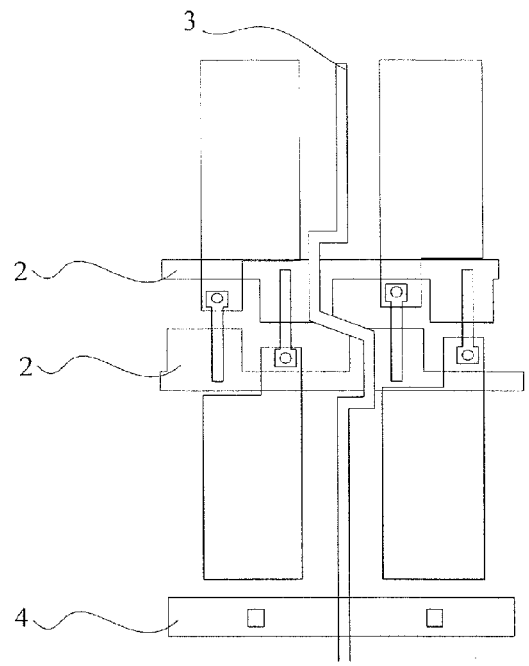
FIG. 7 is a schematically top view showing the structure of another array substrate with a spread-eagled TFT provided by an embodiment of the invention.
Figure 8:
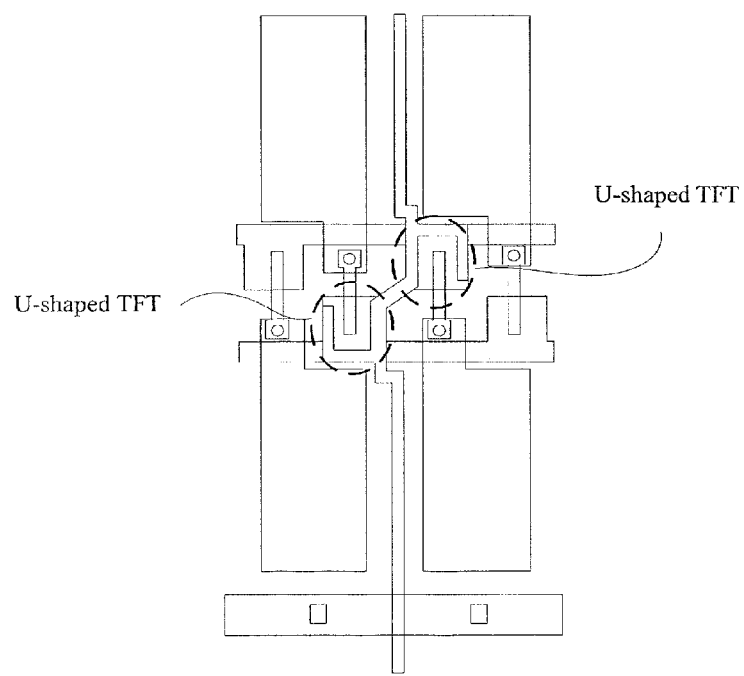
FIG. 8 is a schematically top view showing the structure of an array substrate with a U-shaped TFT provided by an embodiment of the invention.
Figure 9:
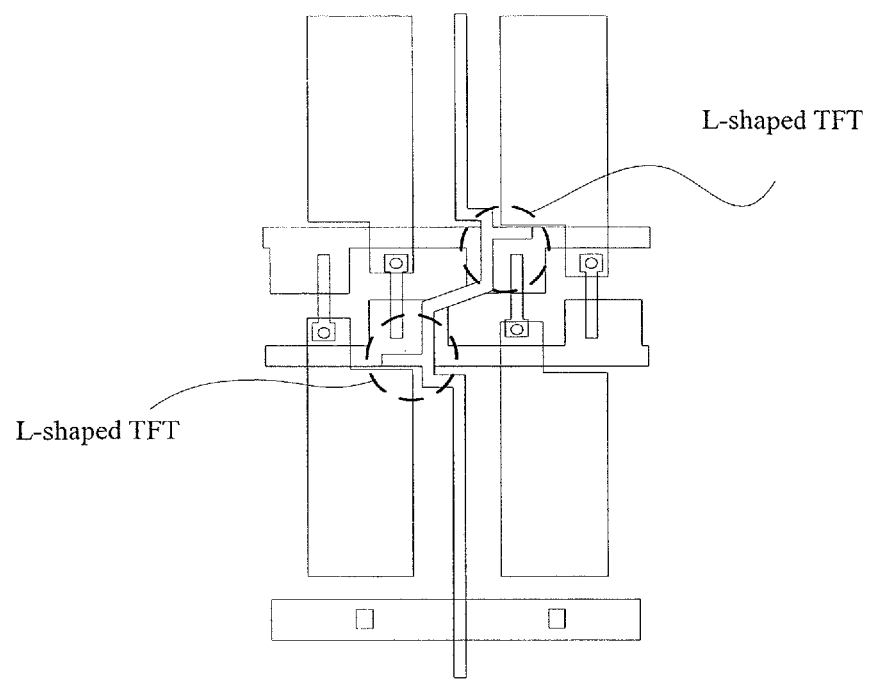
FIG. 9 is a schematically top view showing the structure of an array substrate with a L-shaped TFT provided by an embodiment of the invention.

The TFT array substrate 100 shown in FIG. 3 may further adopt a modification shown in FIG. 7. The embodiment shown in FIG. 7 and the embodiment shown in FIG. 3 only differ in the position where TFTs are located. Further, TFTs shown in FIG. 3 and FIG. 7 are both "I"-shaped TFTs, but the invention is not limited to TFTs of such a structure. For example, "U"-shaped and "L"-shaped TFTs may also be adopted, and they are shown in FIG. 8 and FIG. 9, respectively. Here, "I"-shape, "U"-shape and "L"-shape correspond to the shape of the profile of a channel portion (a portion between a source electrode and a drain electrode opposite to each other) of one TFT.

The shapes of data lines in the array substrate provided by embodiments of the invention is not limited to the examples as stated above and shown in the drawings, and other connection shape of data lines with respect to TFT may also be adopted. A drain electrode of a TFT and a pixel electrode may not be connected through a via hole, and other manners may also be adopted, for example, they can be connected by direct overlap-joint, as long as connection can be realized.

The above TFT array substrate can be applied to a liquid crystal display panel provided by the invention, i.e., the display panel comprises a counter substrate (e.g. a color filter substrate) and the above array substrate, which are provided opposite to each other so as to form a liquid crystal cell.

Figure 12:
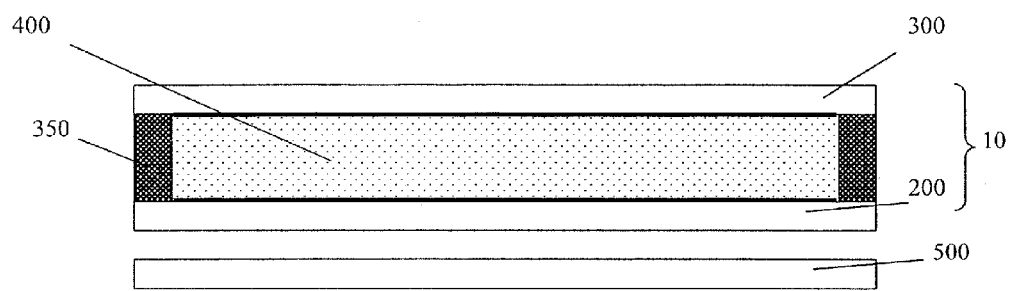
FIG. 12 is a schematically cross-sectional view showing a liquid crystal display panel provided by an embodiment of the invention.

As shown in FIG. 12, the display panel 10 comprises a counter substrate 300 and an array substrate 200 according to any of the above embodiments, which assembled together to form a cell. The counter substrate 300 comprises a black matrix corresponding to pixel units of the array substrate 200. The array substrate 200 and the counter substrate 300 are provided opposite to each other so as to form a liquid crystal cell with a liquid crystal material 400 filled therein and the liquid crystal cell is sealed by sealant 350. The counter substrate 300 is for example a color filter substrate, a black matrix on which defines pixel units corresponding to pixel units on the array substrate 200, and in each sub-pixel unit of the color filter substrate, there are formed color filters, such as RGB filters. In some examples, the liquid crystal display device 10 further comprises a backlight source 500 for providing backlight for display, for example, which is located below the array substrate 300.

Preferably, in the liquid crystal display panel, the projection of gate lines on the array substrate falls within the projection of the black matrix on the counter substrate (e.g., a color filter substrate).

Preferably, for the liquid crystal display panel, on the counter substrate (e.g. a color filter substrate) side, the shape of a black matrix corresponding to the gate lines and the shape of a black matrix corresponding to the common electrode lines may also be the same, depending on circumstances.

When one pixel unit consists of a plurality of sub-pixel units, if the black matrix corresponding to the gate lines and the black matrix corresponding to the common electrode lines have the same shape, then a poor phenomenon of horizontal stripes can be avoided.

For example, when one pixel unit consists of red (R), green (G) and blue (B) sub-pixel units, if the black matrix corresponding to the gate lines and the black matrix corresponding to the common electrode lines have the same shape, then the poor phenomenon of horizontal stripes can be avoided.

Figure 10:
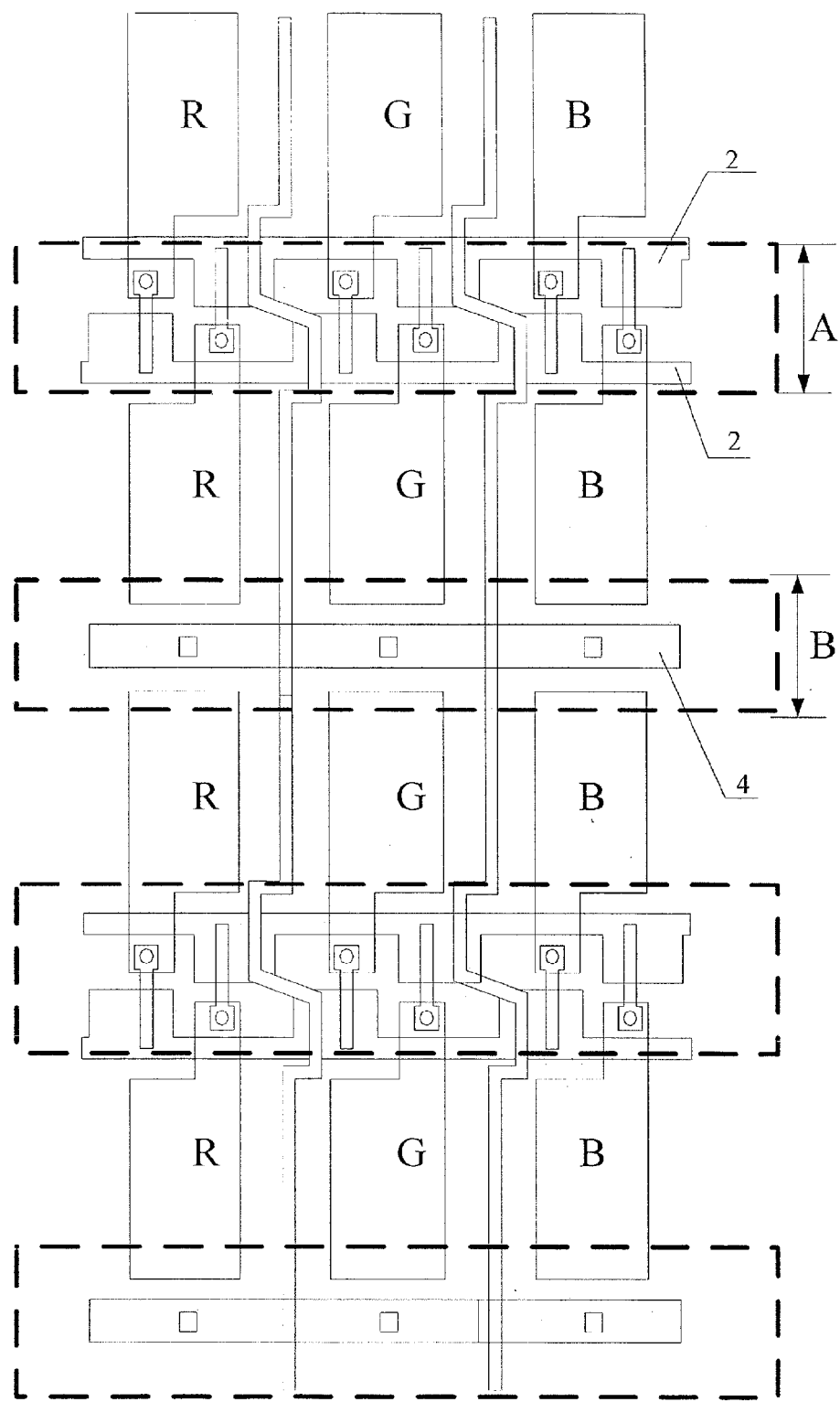
FIG. 10 is a schematic view showing arranging structure of a black matrix, on the premise that a pixel unit consists of R, G and B sub-pixel units, provided by an embodiment of the invention.

As shown in FIG. 10, which is a schematic view showing the structure of an array substrate in which one pixel unit is composed of a red sub-pixel unit (R), a green sub-pixel unit (G) and a blue sub-pixel unit (B), among sub-pixel units in each row, three adjacent sub-pixel units in R, G and B constitute one pixel unit.

As shown in FIG. 10, a light-proof area (an area enclosed by a corresponding broken-line box) where gate lines 2 are located corresponds to a black matrix on the color filter substrate, and the width of the black matrix on the color filter substrate corresponding to the light-proof area where gate lines are located is A.

A light-proof area (an area enclosed by a corresponding broken-line box) where a common electrode line 4 is located corresponds to a black matrix on the color filter substrate, and the width of the black matrix on the color filter substrate corresponding to the light-proof area where the common electrode line is located is B. For example, A=B.

That is, when one pixel unit is composed of a red sub-pixel unit (R), a green sub-pixel unit (G) and a blue sub-pixel unit (B) and the width of the black matrix in an area corresponding to gate lines on the color filter substrate is equal to the width of the black matrix in an area corresponding to a common electrode line (namely, A-B), because TFTs of upper and lower sub-pixels which are adjacent to each other are opposed, the exterior periphery of the black matrixes is parallel to the exterior periphery of the gate lines, and with the common manner of arranging RGB sub-pixels side by side, openings of all pixels are of the same size and of a uniform appearance, and horizontal stripes generated by difference between black matrices in adjacent rows can be avoided.

Certainly, the sub-pixel units in three colors which constitute one pixel unit are not limited to red, green and blue as stated above, and, for example, may be three primary colors (CMY) of cyan, magenta and yellow.

When one pixel unit is composed of sub-pixel units in at least four colors, the black matrix corresponding to the gate lines and the black matrix corresponding to the common electrode line may have different shapes.

For example, when one pixel unit is composed of sub-pixel units in red (R), green (G), blue (B) and white (W), the black matrix corresponding to gate lines and the black matrix corresponding to the common electrode line have different shapes.

Figure 11:
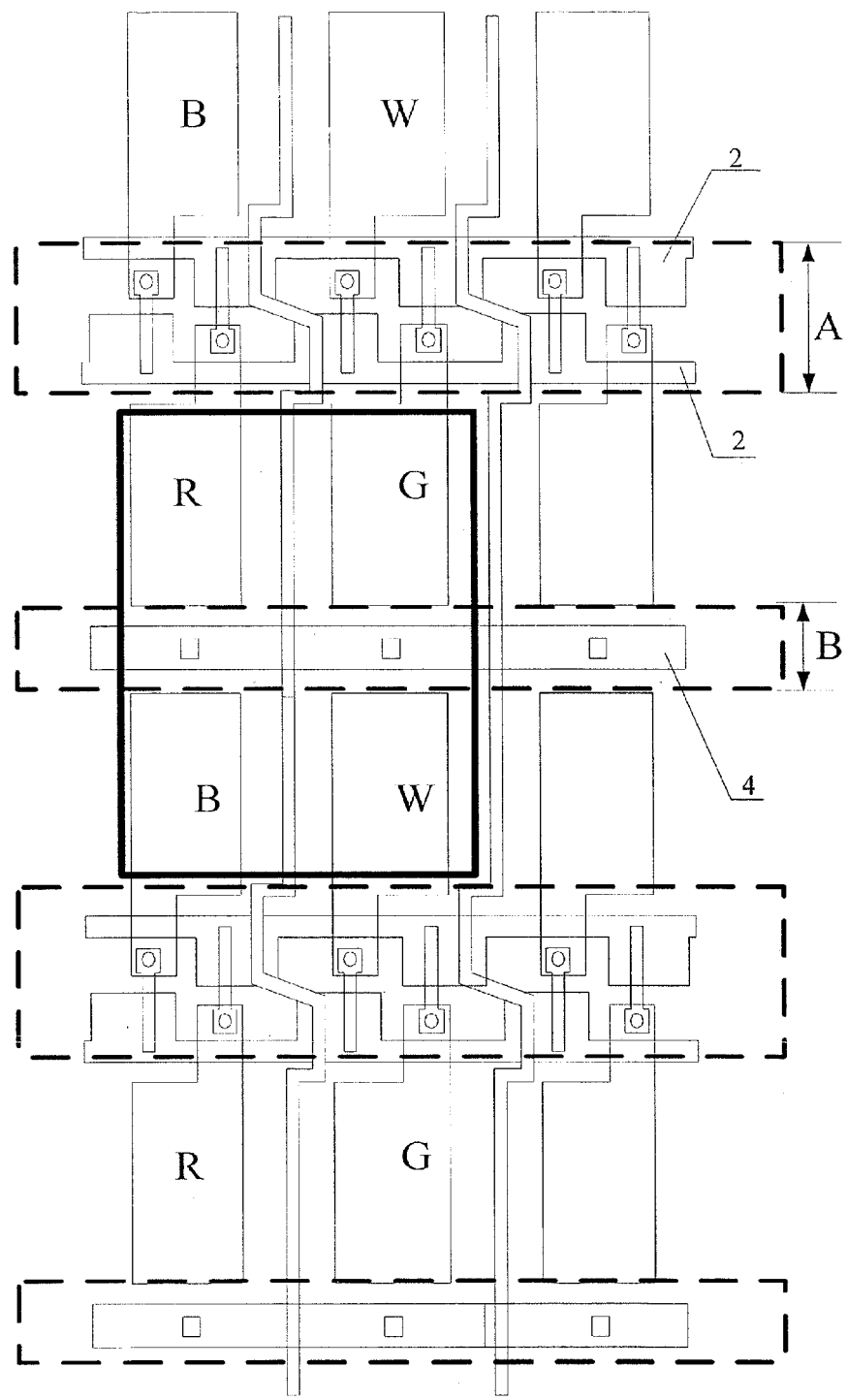
FIG. 11 is a schematic view showing arranging structure of a black matrix, on the premise that a pixel unit consists of R, G, B and W sub-pixel units, provided by an embodiment of the invention.

As shown in FIG. 11, one pixel unit is composed of four sub-pixels in R, G, B and W (for example R, G, B and W shown in a black, bold-line box), which are located in two rows, however, because four sub-pixel units of R, G, B and W in the upper and lower rows constitute one pixel unit, the width of the black matrix (BM) over the gate lines (or TFTs) and the width of the black matrix over the common electrode line may be different, namely, A≠B. As R, G, B and W sub-pixels function as one pixel unit, horizontal stripes will not occur within the pixel units; and furthermore, the spaces between pixel units are periodic and equal to each other. horizontal stripes will not occur between pixel units.

Likewise, the sub-pixel units in four colors which constitute one pixel unit are not limited to the above four types of red, green, blue and white, and, for example, may be four types (CMYK) of cyan, magenta, yellow and black.

According to an embodiment of the invention, there is further provided a display device, comprising the above liquid crystal display panel. The display device may be an ADS mode liquid crystal panel, a liquid crystal display, a liquid crystal television, or the like.

The TFT array substrate, the liquid crystal display panel and the display device provided by the embodiments of the invention meet the following conditions: there is no overlapping area of the projection of the connection area between a TFT of a sub-pixel unit and a pixel electrode with the projection of a gate line for driving the sub-pixel unit in the perpendicular direction (for example, there is no overlapping area between the projection of a drain electrode of the TFT and the projection of the gate line which is provided in opposition to the gate line corresponding to the TFT in the perpendicular direction), the problem that flicker defect occurs in the course of displaying images can be avoided. According to embodiments of the invention, the impact of a gate electrode or a gate line directly below a pixel electrode on image display of the pixel electrode can also be avoided, and further, occurrence of the flicker defect can be avoided, and image display quality can be improved.

Obviously, various modifications and variances can be made on the present invention by those skilled in the art without departing from the spirit and scope of the invention. As such, provided that these modifications and variances of the invention fall into the scope of claims of the invention and their equivalent technologies, it is intended to embrace these modifications and variances within the invention.

What is claimed is:

1. An array substrate, comprising:
a substrate,
data lines and gate lines which are provided on the substrate and intersect with each other, and
sub-pixel units which are defined by surrounding of the data lines and the gate lines and are arranged in an array form;
wherein two gate lines for respectively driving the sub-pixel units in two adjacent rows are located between the sub-pixel units in the two adjacent rows, and
wherein each sub-pixel unit comprises a thin film transistor (TFT) and a pixel electrode, the TFT and the pixel electrode are electrically connected so as to function as a switch element, and a connection area of the TFT and the pixel electrode is located between the two gate lines adjacent to the sub-pixel unit and has no overlapping area with a projection of the two gate lines in a perpendicular direction of the array substrate.

2. The array substrate claimed as claim 1, wherein among the two gate lines between the sub-pixel units in the two adjacent rows, the gate line in a preceding row is connected to the sub-pixel units in a following row, the gate line in the following row is connected to the sub-pixel units in the preceding row, and the two gate lines act to drive the sub-pixel units connected to them, respectively, or
wherein among the two gate lines between the sub-pixel units in the two adjacent rows, the gate line in a preceding row is connected to the sub-pixel units in the preceding row, the gate line in a following row is connected to the sub-pixel units in the following row, and the two gate lines act to drive the sub-pixel units connected to them, respectively.

3. The array substrate claimed as claim 2, wherein TFTs of two sub-pixel units in a same column among the sub-pixel units in the two adjacent rows are provided to be staggered with each other.

4. The array substrate claimed as claim 2, wherein the TFT of each sub-pixel unit is provided on one of the gate lines for driving the sub-pixel unit, a drain electrode of the TFT is connected to the pixel electrode within the sub-pixel unit, and there is no overlapping area between the drain electrode and a projection of the other of the two gate lines in the perpendicular direction.

5. The array substrate claimed as claim 4, wherein the pixel electrode comprises a portion located between the two gate lines adjacent to the pixel unit and a portion located outside of the two gate lines, and the drain electrode is connected to the portion located between the two of the gate lines in the pixel electrode.

6. The array substrate claimed claim 1, wherein each sub-pixel unit further comprises a common electrode, and the common electrode, the gate line corresponding to the pixel unit, and the pixel electrode are located on different layers and insulated from each other.

7. The array substrate claimed as claim 6, wherein the common electrode is located under the pixel electrode and over the gate line corresponding to the pixel unit; and the gate line corresponding to the pixel unit is located within a projection area of the common electrode in the perpendicular direction.

8. The array substrate claimed as claim 6, further comprising a plurality of common electrode lines which are located below the common electrode and insulated from the common electrode, and the common electrode is connected to one of the common electrode line through a second via hole.

9. The array substrate claimed as claim 8, wherein the plurality of common electrode lines are distributed in a display area and a periphery area of the array substrate.

10. The array substrate claimed as claim 1, wherein the drain electrode and the pixel electrode are located on different layers, and are electrically connected through a first via hole.

11. An liquid crystal display panel, comprising a counter substrate and an array substrate which are assembled together to form a cell, wherein the array substrate is the array substrate claimed as claim 1.

12. The liquid crystal display panel claimed as claim 11, wherein a projection of the gate lines falls within a projection of a black matrix on the counter substrate.

13. The liquid crystal display panel claimed as claim 11, wherein on the counter substrate, when one pixel unit is composed of sub-pixel units in three colors, a black matrix corresponding to the gate lines and a black matrix corresponding to the common electrode lines have a same width;

when one pixel unit is composed of sub-pixel units in at least four colors, a black matrix corresponding to the gate lines and a black matrix corresponding to the common electrode lines have different widths.

* * * * *